(12) United States Patent
Kelleher

(10) Patent No.: US 8,701,057 B2
(45) Date of Patent: Apr. 15, 2014

(54) DESIGN, LAYOUT, AND MANUFACTURING TECHNIQUES FOR MULTIVARIANT INTEGRATED CIRCUITS

(75) Inventor: Brian Kelleher, Palo Alto, CA (US)

(73) Assignee: Nvidia Corporation, Santa Clara, CA (US)

( * ) Notice: Subject to any disclaimer, the term of this patent is extended or adjusted under 35 U.S.C. 154(b) by 151 days.

(21) Appl. No.: 13/084,364

(22) Filed: Apr. 11, 2011

(65) Prior Publication Data

US 2012/0258579 A1    Oct. 11, 2012

(51) Int. Cl.
*G06F 17/50* (2006.01)

(52) U.S. Cl.
USPC .................. 716/56; 716/54; 716/55; 716/119

(58) Field of Classification Search
USPC .............................................. 716/54–56, 119
See application file for complete search history.

(56) References Cited

U.S. PATENT DOCUMENTS

| | | | | |
|---|---|---|---|---|
| 4,430,584 A | * | 2/1984 | Someshwar et al. | 326/37 |
| 5,016,080 A | * | 5/1991 | Giannella | 257/620 |
| 5,459,340 A | * | 10/1995 | Anderson et al. | 257/203 |
| 5,654,588 A | * | 8/1997 | Dasse et al. | 257/754 |
| 6,124,143 A | * | 9/2000 | Sugasawara | 438/18 |
| 6,157,213 A | * | 12/2000 | Voogel | 326/41 |
| 6,735,755 B2 | * | 5/2004 | Shau | 326/101 |
| 7,224,042 B1 | * | 5/2007 | McCollum | 257/620 |
| 7,241,635 B1 | * | 7/2007 | Osann, Jr. | 438/14 |
| 7,284,226 B1 | * | 10/2007 | Kondapalli | 326/41 |
| 7,337,425 B2 | * | 2/2008 | Kirk | 716/55 |
| 7,358,601 B1 | * | 4/2008 | Plants et al. | 257/686 |
| 7,590,967 B1 | * | 9/2009 | Kirk | 716/50 |
| 7,718,512 B2 | * | 5/2010 | McCollum | 438/462 |
| 7,882,453 B2 | * | 2/2011 | Malekkhosravi et al. | 716/50 |
| 8,001,511 B1 | * | 8/2011 | Bauer et al. | 716/117 |
| 2005/0023656 A1 | * | 2/2005 | Leedy | 257/678 |
| 2007/0184635 A1 | * | 8/2007 | McCollum | 438/462 |
| 2011/0084314 A1 | * | 4/2011 | Or-Bach et al. | 257/209 |
| 2012/0246379 A1 | | 9/2012 | Kelleher et al. | |
| 2013/0031328 A1 | | 1/2013 | Kelleher et al. | |

\* cited by examiner

*Primary Examiner* — Naum Levin

(57) ABSTRACT

An integrated circuit (IC) is designed that includes one variant having a plurality of a modular circuits communicatively coupled together and a second variant having a sub-set of the plurality of modular circuits. The modular circuits are then laid out on a wafer for fabricating each of the variants of the IC. The layout includes routing communicative couplings between the sub-set of the modular circuits of the second variant to the other modular circuits of the first variant in one or more metallization layers to be fabricated last. Fabricating the IC is then started, up to but not including the one or more metallization layers to be fabricated last. One or more of the plurality of variants of the IC is selected based upon a demand predicted during fabrication. Fabrication then continues with the last metallization layers of the IC according to the selected layout.

8 Claims, 10 Drawing Sheets

DESIGN, LAYOUT, AND MANUFACTURING TECHNIQUES FOR MULTIVARIANT INTEGRATED CIRCUITS

BACKGROUND OF THE INVENTION

Modern electronic devices are implemented utilizing a plurality of integrated circuit (IC) chips. The IC chips are fabricated on a monolithic semiconductor substrate of a wafer. Referring now to FIG. 1, an exemplary semiconductor wafer according to the conventional art is illustrated. The wafer 100 includes a plurality of a given integrated circuits fabricated in an array of dice 110 separated by scribe boundaries 120-150. For example, tens, hundreds or thousands of copies of the same IC chip may be fabricated on a wafer. A chip including a large integrated circuit may include millions or more semiconductor devices, such as transistors.

The semiconductor devices of the integrated circuit are generally fabricated by performing various doping, depositing, patterning and etching processes upon the wafer. The semiconductor devices are then interconnected by a plurality of conductive layers. Referring now to FIG. 2, an exemplary cross sectional view of the plurality of conductive layers in an IC chip according to the conventional art is shown. The conductive layers are typically polysilicon, metal and/or the like. The conductive layers include a plurality of horizontal layers referred to herein as interconnect layers 210 and a plurality of vertical layers referred to herein as via layers 220. The different conductive layers are separated by various passivation layers 230. The conductive layers and passivation layers are also fabricated by various doping, depositing, patterning and etching processes performed on the wafer. A corresponding set of a given via layer 220, a given interconnect layer 210 and a given passivation layer 230 is typically referred to in the art as a metallization layer. A chip including a large integrated circuit may include four or more metallization layers to interconnect the semiconductor devices within the IC chip and provide external connections for control signals, data signals, address signals, supply potentials, and the like.

Referring now to FIG. 3, an exemplary integrated circuit chip fabricated according to the conventional art is shown. The integrated circuit 300 may be laid out on the chip in a plurality of functional blocks 305-370. In various integrated circuits, such a central processing units (CPUs), graphics processing unit (GPUs), digital signal processors (DSPs), microcontrollers and the like, the chip 300 includes one or more core circuits 305, 310, one or more peripheral circuits 315-350, and/or the like. For example, a graphics processing unit may include a plurality of cores 305, 310, a plurality of memory bus interface circuits 315-330, a plurality of communication bus interface circuits 335, 340, a plurality of display interface circuits 345, 350, and/or the like. In addition, one or more functional blocks 305, 310 may include one or more sub-blocks 355-370. For example, the core circuits 305, 310 of a graphics processing unit may include sub-blocks 355, 360 for communicating between core circuits 305, 310, system sub-blocks 365, 370 for controlling operation within the respective core circuits 305, 310 and communication between core circuits 305, 10, and/or the like. The modular circuit architecture is utilized to simplify the design of the integrated circuit, improve the manufacturability of the integrated circuit and/or improve the performance of the integrated circuit. However, there is a continuing need for improved design, layout and manufacturing techniques.

SUMMARY OF THE INVENTION

The present technology may best be understood by referring to the following description and accompanying drawings that are used to illustrate the embodiments of the present technology directed toward integrated design, layout, and manufacturing techniques for multivariant integrated circuits.

In one embodiment, the technique includes designing a first set of one or more modular circuits and a second set of one or more modular circuits, wherein the first set of modular circuits are adapted to separately implement a first one of a plurality of selectable integrated circuits and the second set of modular circuits are adapted to separately implement a second one of a plurality of selectable integrated circuits, or the first and second set of the modular circuits are adapted to combine to implement a third one of a plurality of selectable integrated circuits. The first and second set of one or more modular circuits are laid out, wherein each combination of the first and second set of modular integrated circuits are separated from others by primary scribe boundaries. The first set and second set of the modular circuits of each combination are separated by a secondary scribe boundary. In addition, interconnects and vias between the first set and second set of the modular circuits are laid out in one or more metallization layers to be fabricated last. The combinations of the first and second sets of one or more modular circuits are then fabricated, up to but not including the one or more metallization layers including the interconnects and vias between the first set and second set of the modular circuits, on a wafer according to the layout. A demand for each of the first, second, and third integrated circuits is predicted during fabrication of the plurality of first and second sets of modular circuits up to the one or more metallization layers including the interconnects and vias between the first and second sets of the modular circuits. The one or more metallization layers including the interconnects and vias between the first and second sets of the modular circuits are then selectively fabricated or not based upon the predicted demand for the first second and third integrated circuits. The wafer is then selectively singulated into a first plurality of dice each including the first set of one or more modular circuits and a second plurality of dice each including the second set of one or more modular circuits along the primary and secondary scribe boundaries, or into a third plurality of dice each including the first and second set of modular integrated circuits and the interconnects and vias along the primary scribe boundaries.

BRIEF DESCRIPTION OF THE DRAWINGS

Embodiments of the present technology are illustrated by way of example and not by way of limitation, in the figures of the accompanying drawings and in which like reference numerals refer to similar elements and in which.

DETAILED DESCRIPTION OF THE INVENTION

Reference will now be made in detail to the embodiments of the present technology, examples of which are illustrated in the accompanying drawings. While the present technology will be described in conjunction with these embodiments, it will be understood that they are not intended to limit the invention to these embodiments. On the contrary, the invention is intended to cover alternatives, modifications and equivalents, which may be included within the scope of the invention as defined by the appended claims. Furthermore, in the following detailed description of the present technology, numerous specific details are set forth in order to provide a thorough understanding of the present technology. However, it is understood that the present technology may be practiced without these specific details. In other instances, well-known methods, procedures, components, and circuits have not been described in detail as not to unnecessarily obscure aspects of the present technology.

In this application, the use of the disjunctive is intended to include the conjunctive. The use of definite or indefinite articles is not intended to indicate cardinality. In particular, a reference to "the" object or "a" object is intended to denote also one of a possible plurality of such objects.

Figure 1:
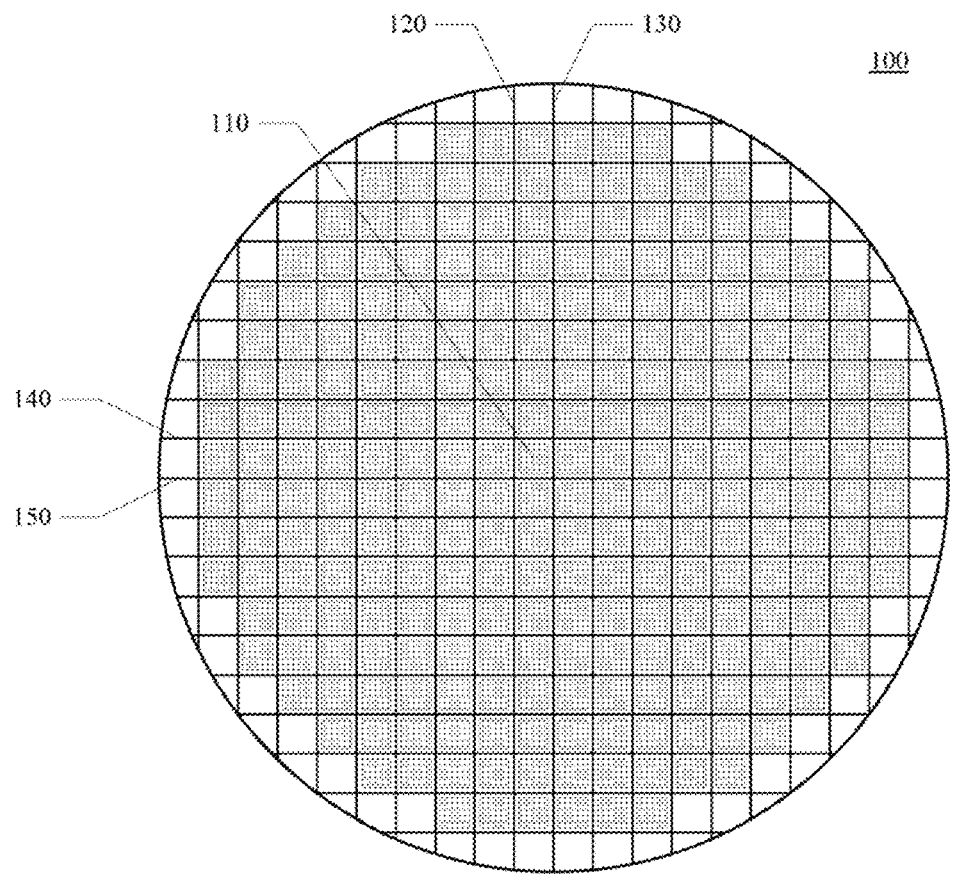
FIG. 1 shows a block diagram of an exemplary semiconductor wafer according to the conventional art.
Figure 2:
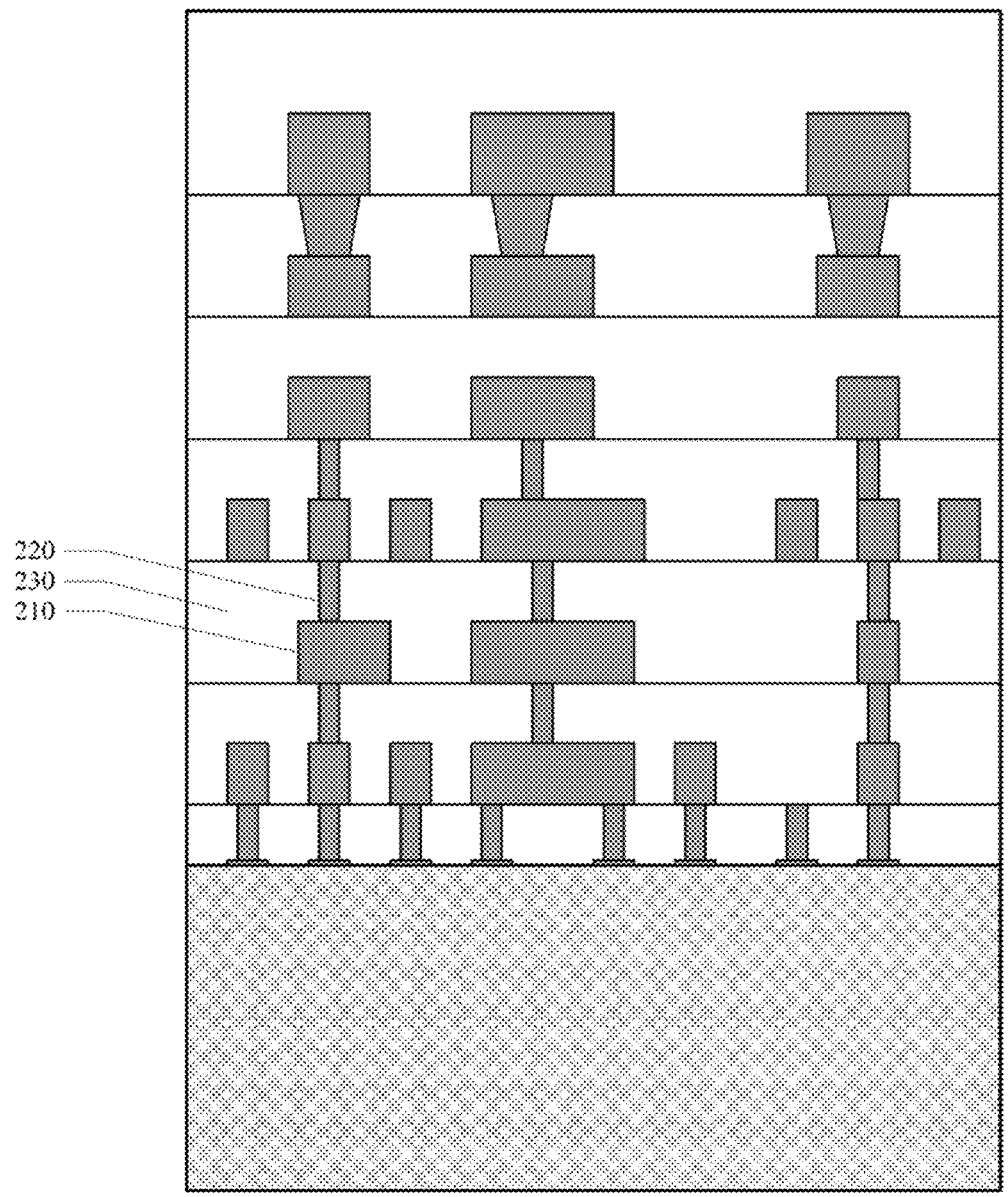
FIG. 2 shows a block diagram of an exemplary cross sectional view of the plurality of conductive layers in an IC chip according to the conventional art.
Figure 3:
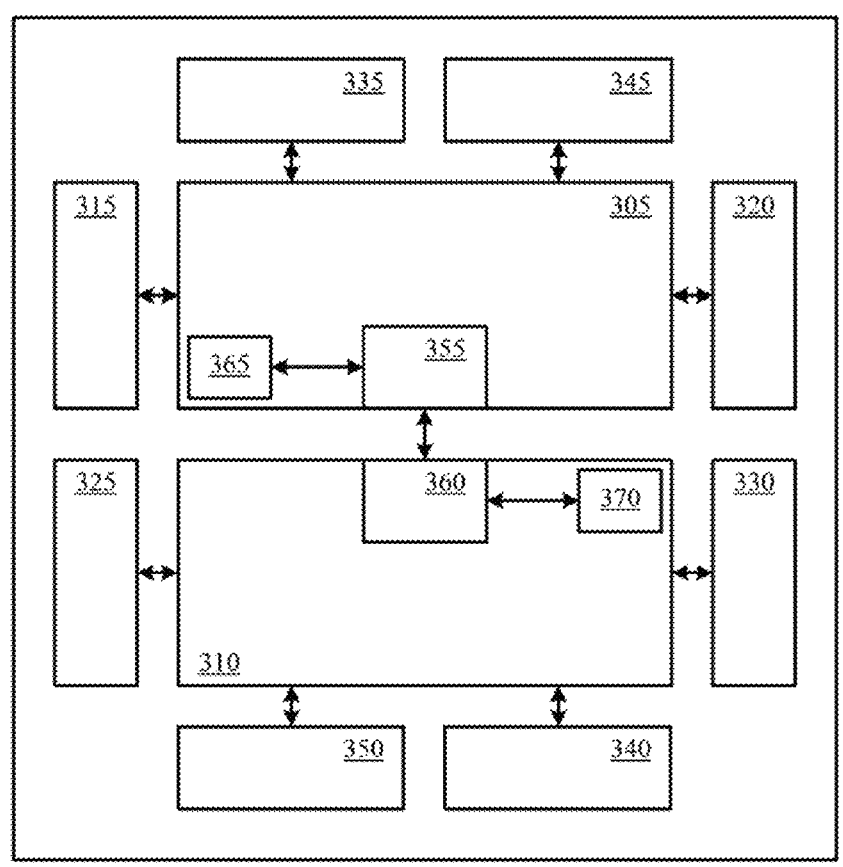
FIG. 3 shows a block diagram of an exemplary integrated circuit of a chip according to the conventional art.
Figure 4A:
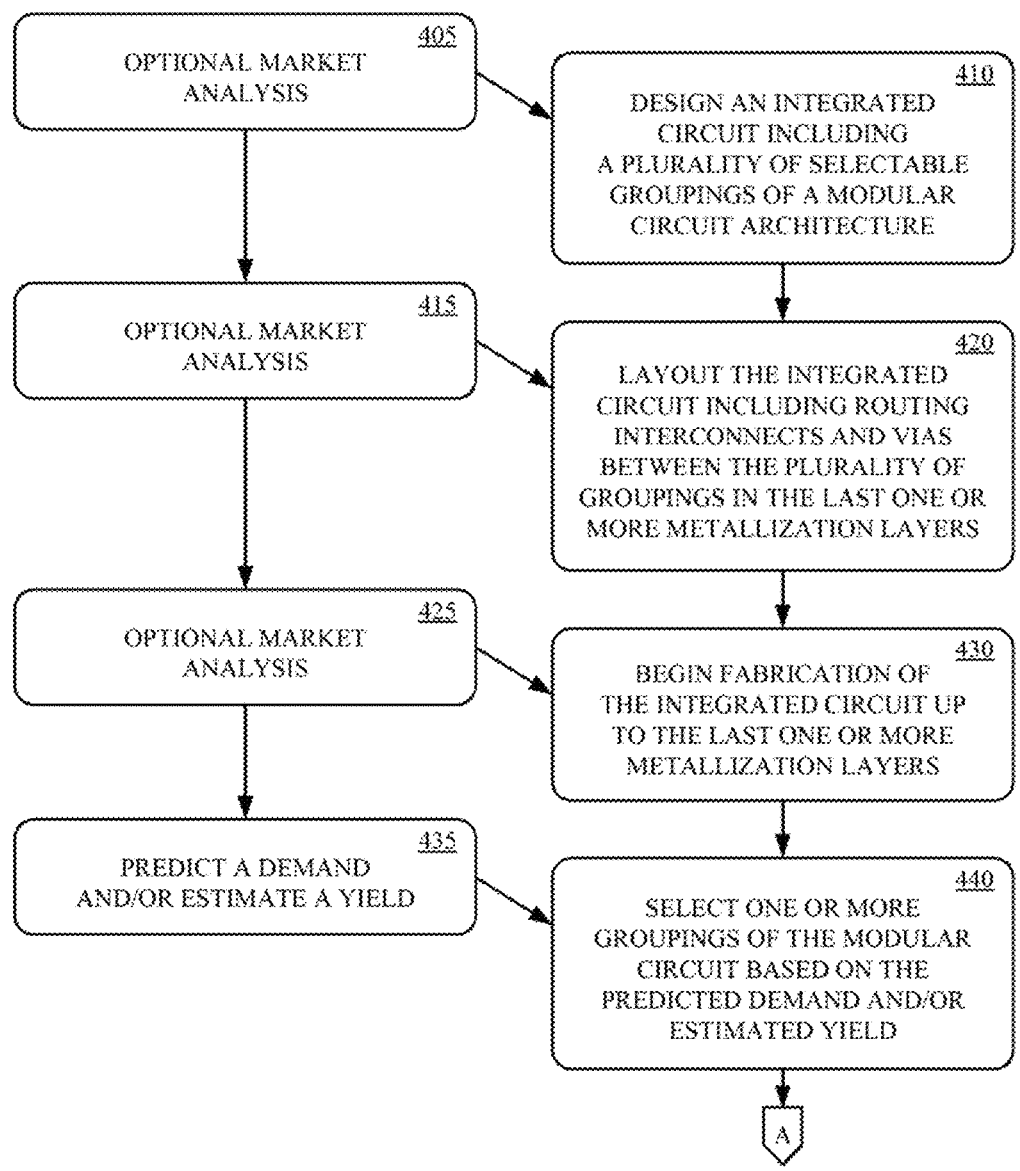
FIGS. 4A and 4B show a flow diagram of an exemplary product lifecycle of an integrated circuit, in accordance with one embodiment of the present technology.
Figure 4B:
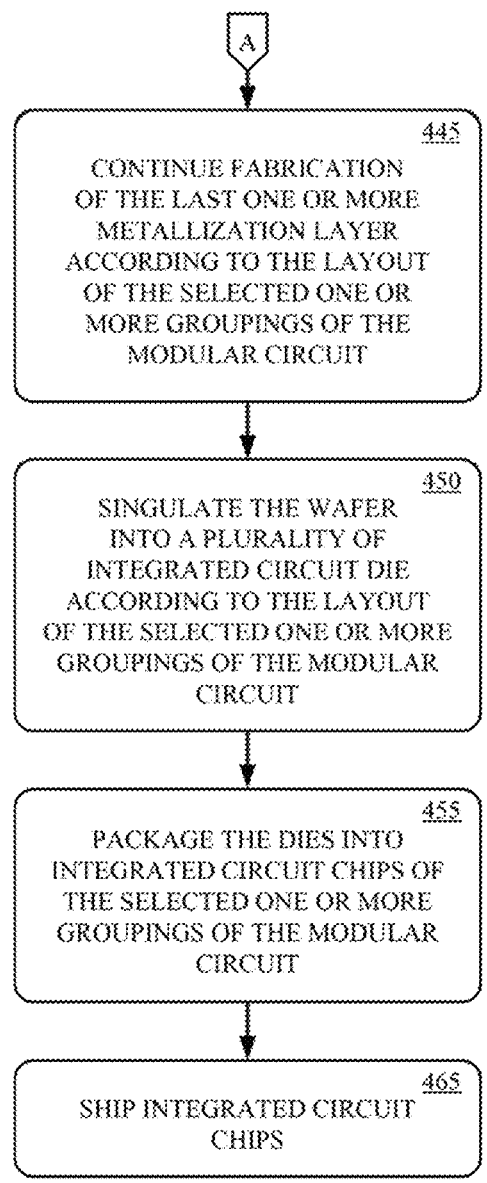

Referring now to FIGS. 4A and 4B, an exemplary product lifecycle of an integrated circuit, in accordance with one embodiment of the present technology, is illustrated. Generally, a product lifecycle includes designing the integrated circuit, laying out the integrated circuit for manufacturing on a wafer, fabrication of the integrated circuit on the wafer, packaging the integrated circuit as chips, and shipping the integrated circuit chips to customers. The product lifecycle may also include market analysis, design verification, test fabrication, in fabrication testing, final package testing and/or the like.

In one embodiment, the product lifecycle may begin with an optional initial market analysis prior to or during a design phase, at 405. The initial market analysis may identify product features, performance, costs and/or the like for the design of a product. The initial market analysis may also predict a demand for the product when it is expected to ship to customers. For example, a market analysis may identify the need for a product family including a high performance processor variant, a midrange processor variant, and an entry level processor variant each based on a modular circuit architecture.

At 410, an integrated circuit including a plurality of selectable grouping of a modular circuit is designed. For example, the design may include a first variant that includes a single core and associated peripheral circuits, and a second variant that includes two cores and associated peripheral circuits. In another example, a performance processor variant in a product family may include seven cores and associated peripheral circuits, a midrange processor variant may include five cores and associated peripheral circuits, and the entry level processor variant may include two cores in response to the initial market analysis. The performance processor is implemented by combining the set of five cores and associated peripheral circuits and the set of two cores and associated peripheral circuits. Alternatively, the set of five cores and associated peripheral circuits may separately implement the midrange processor, and the set of two cores and associated peripheral circuits may separately implement the entry level processor.

The design of the modular circuit architecture may be implemented by one or more computer implemented design and simulation tools. The design and simulation tools may be one or more computing device readable instructions and data (e.g., programs) stored on one or more computing device readable media (e.g., computer memory) which when executed by one or more processors design and simulate integrated circuit devices, sub-circuits, circuits and/or the like.

At 415, additional market analysis may optionally be performed prior to or during a layout phase. The additional market analysis may be performed to improve the prediction of the demand for each of the plurality of variants in the product family when the product is expected to ship to customers. Alternatively or in addition, an initial estimate of the expected yield for each selectable grouping of the modular circuits may be performed prior to or during the layout phase. At 420, the modular circuit architecture of the integrated circuit is laid out into a plurality of selectable groupings for fabrication on a wafer. The layout includes secondary scribe boundaries between two or more selectable groupings of the modular circuit. The layout also includes routing interconnects and vias for signals, supply potentials, and the like that cross the secondary scribe boundaries, between the two or more selectable grouping, in the last one or more metallization layers to be fabricated. The layout may also be based upon the results of the market analysis, the estimated yield, and/or the like.

The layout of the modular circuit architecture may be implemented by one or more computer implemented integrated circuit layout tools. The integrated circuit layout tools may be one or more computing device readable instructions and data (e.g., programs) stored on one or more computing device readable media (e.g., computer memory) which when executed by one or more processors place the devices and route the interconnects and vias of the integrated circuit.

Figure 5:
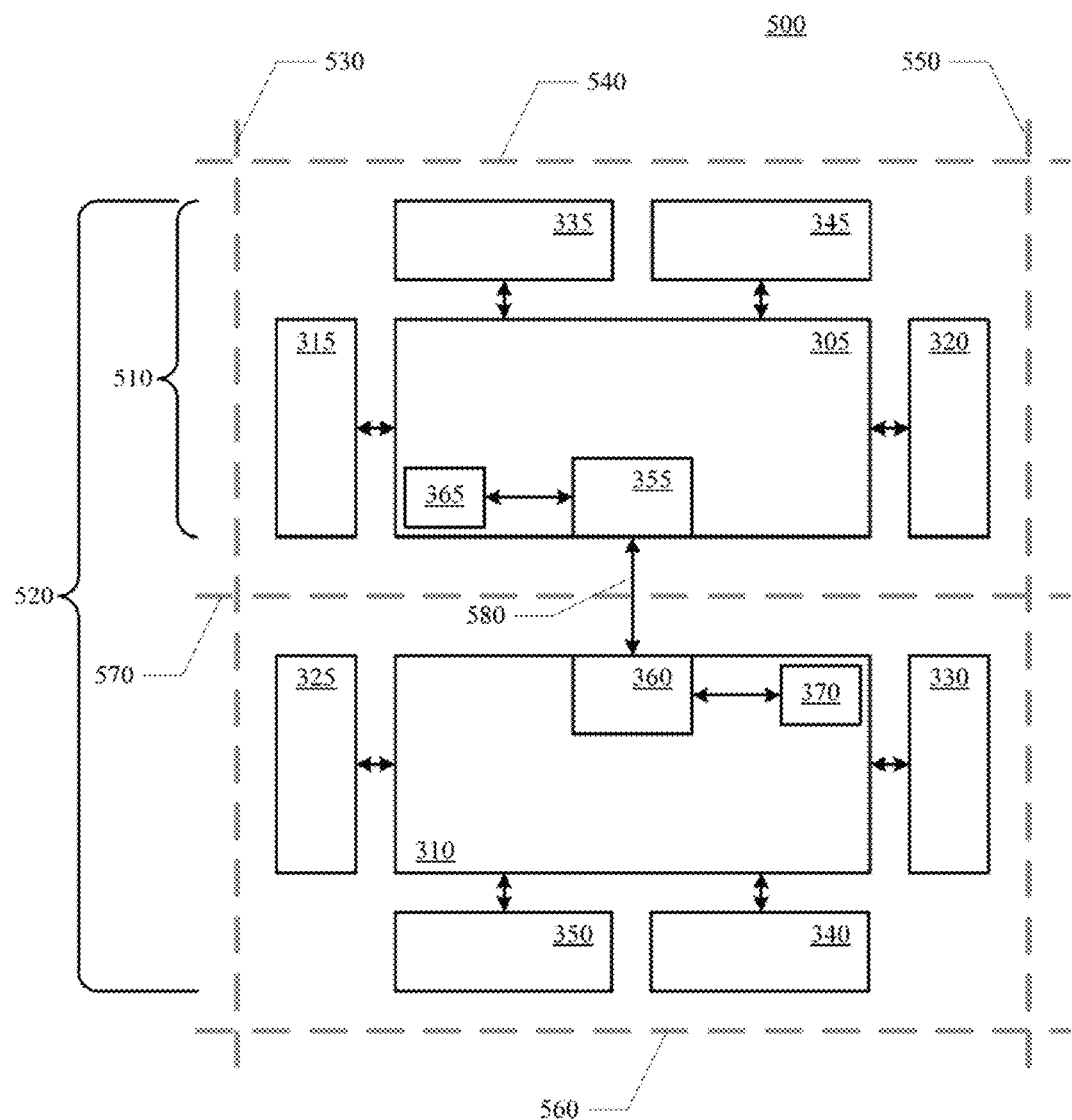
FIG. 5 shows a block diagram of a portion of a wafer including an exemplary integrated circuit in accordance with one embodiment of the present technology.

Referring now to FIG. 5, a portion of a wafer including an exemplary integrated circuit, in accordance with one embodiment of the present technology, is illustrated. As illustrated, an integrated circuit is laid out in two different selectable groupings 510, 520 of a modular circuit. The integrated circuit may be for instance a modular circuit architecture including one or more cores 305, 310 and one or more peripheral circuits 315-350. A first selectable grouping 520 includes two modular circuits fabricated on a die. A second selectable grouping 510 includes a single modular circuit fabricated on a die. The two modular circuits are laid out including primary 530-560 and secondary 570 scribe boundaries. The two modular circuits are further laid out including interconnects 580 between the two modular circuits that cross a secondary scribe boundary 570 in the last one or more metallization layers. The interconnects and vias 580 between the two modules that cross the secondary scribe boundary 570 are adapted to be selectively fabricated depending upon the particular grouping selected.

Referring again to FIG. 4A, additional market analysis may also optionally be performed prior to or during the start of device fabrication, at 425. The additional market analysis may be performed to improve the prediction of the demand for each of the plurality of variants in the product family when the product is expected to ship to customers. Alternatively or in addition, an updated estimate of the expected yield for each selectable grouping of the modular circuits may be performed prior to or during the start of device fabrication.

After the layout has been completed and verified, the product family is put into production based upon the predicted demand and/or expected yield for each variant in the product family. The quantity of integrated circuits to be fabricated may be based upon the expected fabrication yield, the predicted demand, and/or the like. For example, the market analysis may indicate that the market is expected to be strong demand for a large volume at a relative low price for the low end chip, weak demand for the midrange price/performance chip, and a strong demand for a small volume at a premium price for the high end chip in the family.

At 430, fabrication of the integrated circuits on a wafer up to but not including metallization is started according to the layout. Fabrication includes various processes such as cleaning, depositing, doping, etching, and/or the like to form one or more regions such as wells, shallow trench isolation regions, source regions, drain regions, gate regions, channel regions, and/or the like. The fabrication of the integrated circuits up to but not including metallization may typically take weeks, months or more. For example, the fabrication of multi-core graphics processors up to but not including metallization may take approximately six to twelve weeks depending upon the design.

The fabrication the integrated circuits may be performed by one or more pieces of manufacturing equipment. Operation and control of the equipment may be implemented by one or more computer implemented fabrication control tools. The fabrication control tools may be implemented by one or more computing device readable instructions and data (e.g., programs) stored on one or more computing device readable media (e.g., computer memory) which when executed by one or more processors control the operation of one or more of the fabrication equipment.

At 435, a demand for each of the plurality of selectable groupings of the modular circuit is predicted during fabrication of the integrated circuit up to but not including the interconnects and vias. Alternatively or in addition, a yield for each of the plurality of selectable groupings of the modular circuit may be predicted during fabrication of the integrated circuit up to but not including the interconnects and vias. In one implementation, a final prediction of the demand, when the product is expected to ship to customers, may be performed for each of the plurality of variants in the product family. The demand prediction may be performed by one or more computer implemented market analysis tools. The market analysis tools may be implemented by one or more computing device readable instructions and data (e.g., programs) stored on one or more computing device readable media (e.g., computer memory) which when executed by one or more processors predict a market demand for a given product.

At 440, one or more of the plurality of groupings of the modular circuit are selected for fabrication based upon the predicted demand and/or yield at process 435. The demand and/or yield predicted during fabrication may also be utilized to revise the quantity of wafers put into production at process 430.

Referring now to FIG. 4B, fabrication continues with formation of interconnects and vias of the integrated circuit according to the layout of the selected one or more groupings of the modular circuit, at 445. The interconnects and vias between the modular circuits that cross the secondary scribe boundary are selectively fabricated or not depending upon a particular selected grouping. It is appreciated that if the interconnects and vias extend across scribe boundaries, the cut metal could cause contamination issues that may deleteriously affect the performance of the resulting integrated circuit chips. Therefore, the interconnects and vias of metallization layers that cross secondary scribe boundaries are fabricated if the selected one or more groupings of the modular circuit are not going to be separated along the secondary scribe boundaries. However, if the one or more groupings of the modular circuit are going to be separated along the secondary scribe boundaries, the interconnects and vias that cross secondary scribe boundaries according to the layout are not fabricated.

For example, a wafer may include one hundred sets of the processor cores and associated peripheral circuits illustrated in FIG. 5. The final market analysis may predict a need for fifty thousand single core integrated circuit chips 510 and twenty thousand dual core integrated circuit chips 520. As a result two hundred fifty wafers will be fabricated without interconnects and vias between corresponding pairs of processor cores (e.g., across the secondary scribe boundaries). In addition, two hundred wafers will be fabricated with interconnects and vias 580 between corresponding pairs of processors. For simplicity, this example assumes one hundred percent yield from the wafers. However, those skilled in the art appreciate that the number of wafers fabricated will need to be increased to compensate for yield losses.

Again, the fabrication may be implemented by one or more computer implemented fabrication control tools, fabrication equipment, and/or the like. The fabrication control tools may be implemented by one or more computing device readable instructions and data (e.g., programs) stored on one or more computing device readable media (e.g., computer memory) which when executed by one or more processors control the operation of one or more pieces of the fabrication equipment.

Referring again to FIG. 4B, the wafer is singulated into a plurality of integrated circuit die according to the layout of the selected one or more groupings of the modular circuit, at 450. For example, the five hundred wafers without interconnects and vias between corresponding pairs of processor cores (e.g., single core integrated circuit chips) are singulated into die by cutting the wafer along both the primary 530-560 and secondary 570 scribe boundaries, as illustrated in FIG. 5. The five hundred wafers with interconnects and vias 580 between corresponding pairs of processor cores (e.g., dual core processor integrated circuit chips) are singulated into die by cutting the wafer along the primary scribe boundaries 530-560 and not the secondary scribe boundary 570.

Referring again to FIG. 4B, the singulated die are packaged into a plurality of integrated circuit chips, at 455. In one implementation, contacts on each die are electrically coupled to corresponding contacts on a chip substrate and the die and chip substrate are encapsulated to form the finished integrated circuit chips adapted for mounting on printed circuit boards or the like. Singulation and packaging may also be implemented by one or more computer implemented fabrication control tools, fabrication equipments and/or the like. The packaged integrated circuit chips may then be shipped to customers, at 460.

Figure 6:
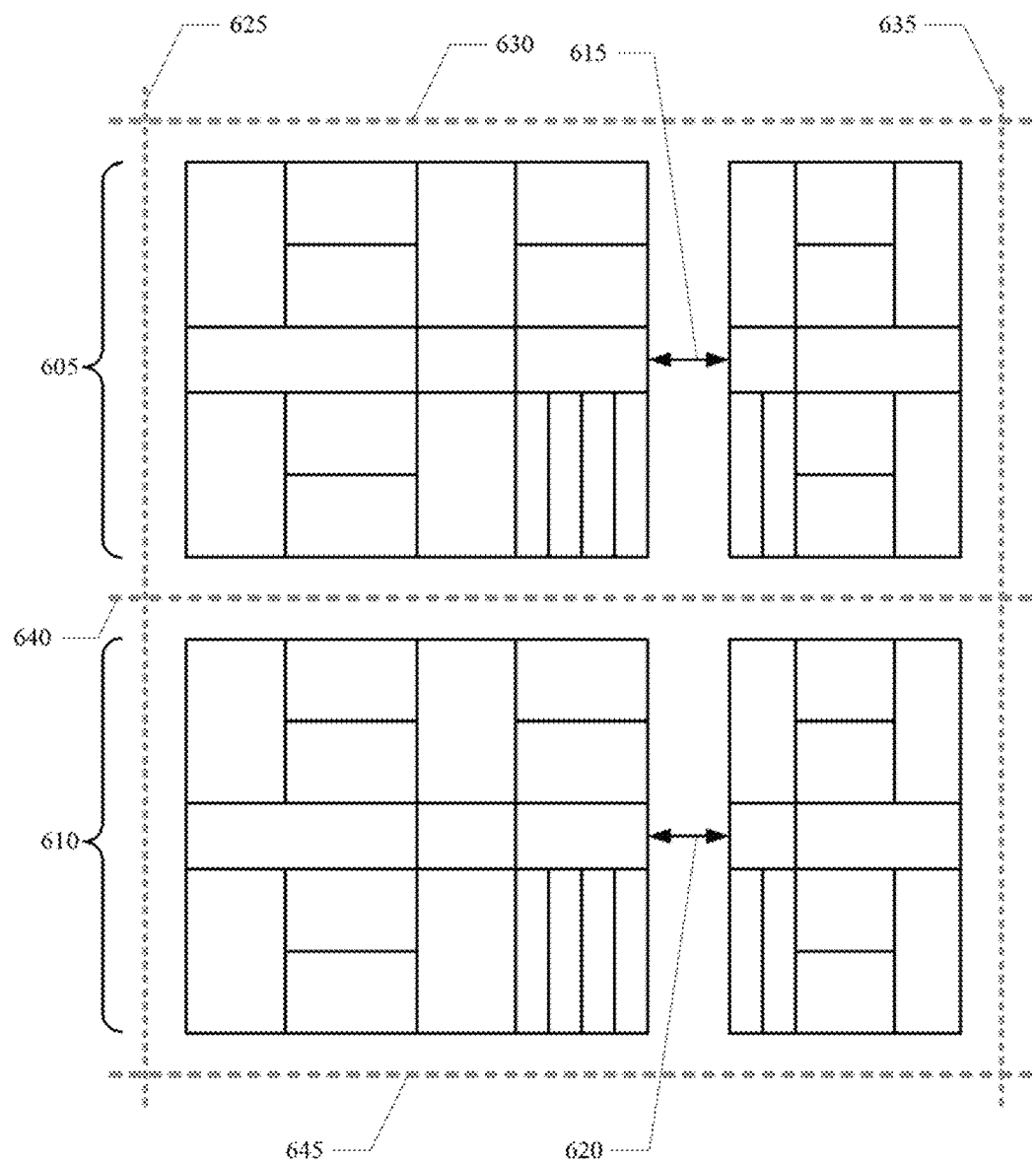
FIG. 6 shows a block diagram of a portion of a wafer including an exemplary integrated circuit in accordance with another embodiment of the present technology.
Figure 7:
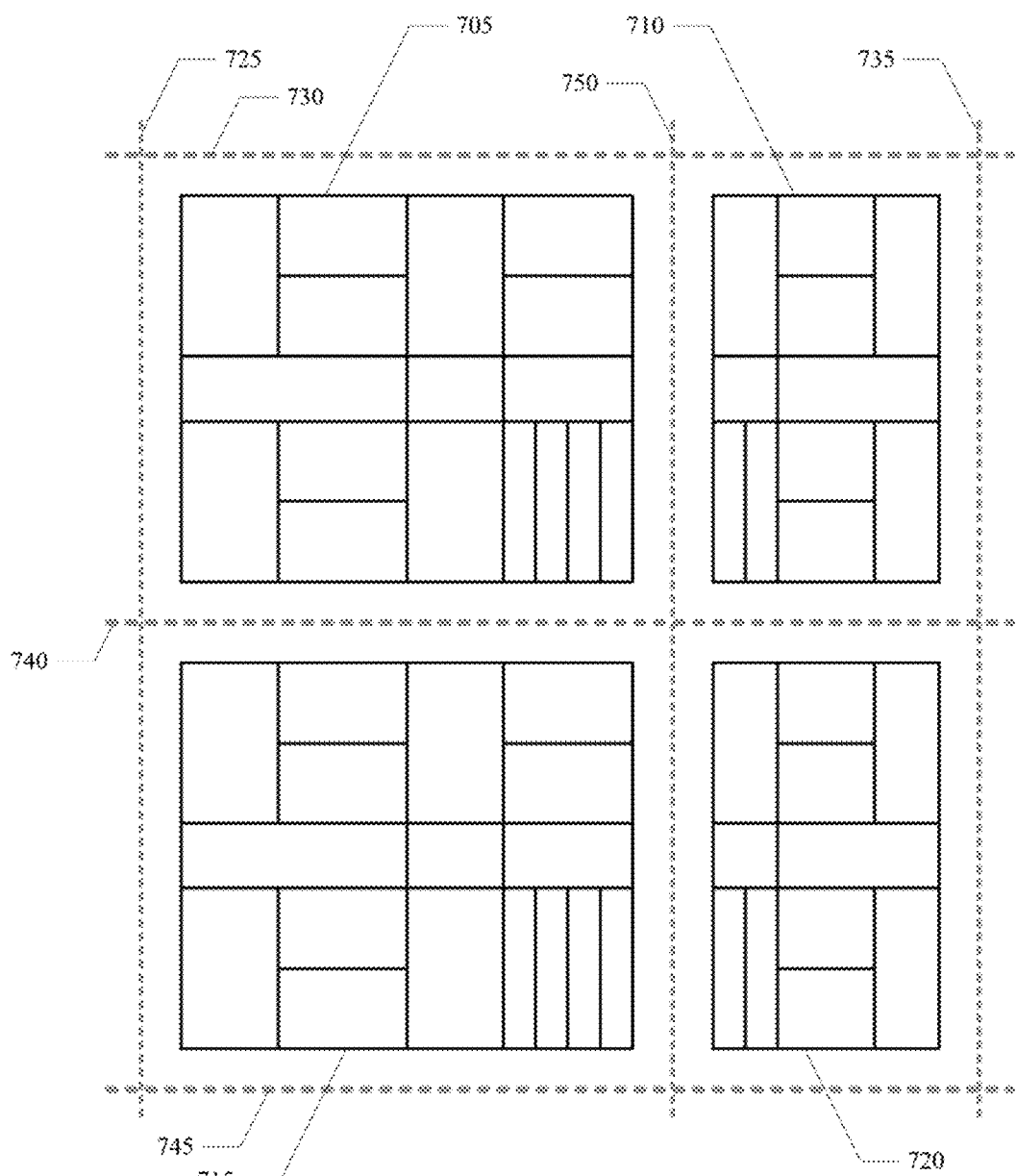
FIG. 7 shows a block diagram of a portion of a wafer including another exemplary integrated circuit in accordance with another embodiment of the present technology.

Embodiments of the present technology may also be practiced with symmetrical or asymmetrical modular circuit architectures. For example, a portion of a wafer including an exemplary integrated circuit in accordance with another embodiment of the present technology is illustrated in FIGS. 6 and 7. As illustrated in FIG. 6, a plurality of integrated circuit dice 605, 610 may be fabricated with seven cores and associated peripheral circuits by including interconnects and vias 615, 620 between a first set of five cores and a second set of two cores during metallization. The integrated circuit dice 605, 610 are then singulated by cutting the wafer along scribe boundaries 625-645. Alternatively, as illustrated in FIG. 7, a plurality of two different integrated circuit dice 705-720 may be fabricated, one lot of die with five cores 705, 715 and a second lot with two cores 710, 720 by leaving out interconnects and vias between the five core circuits and the two core circuits during metallization. The integrated circuit dice 705-720 are then singulated by cutting the wafer along primary scribe boundaries 725-745 and the secondary scribe boundary 750.

Figure 8A:
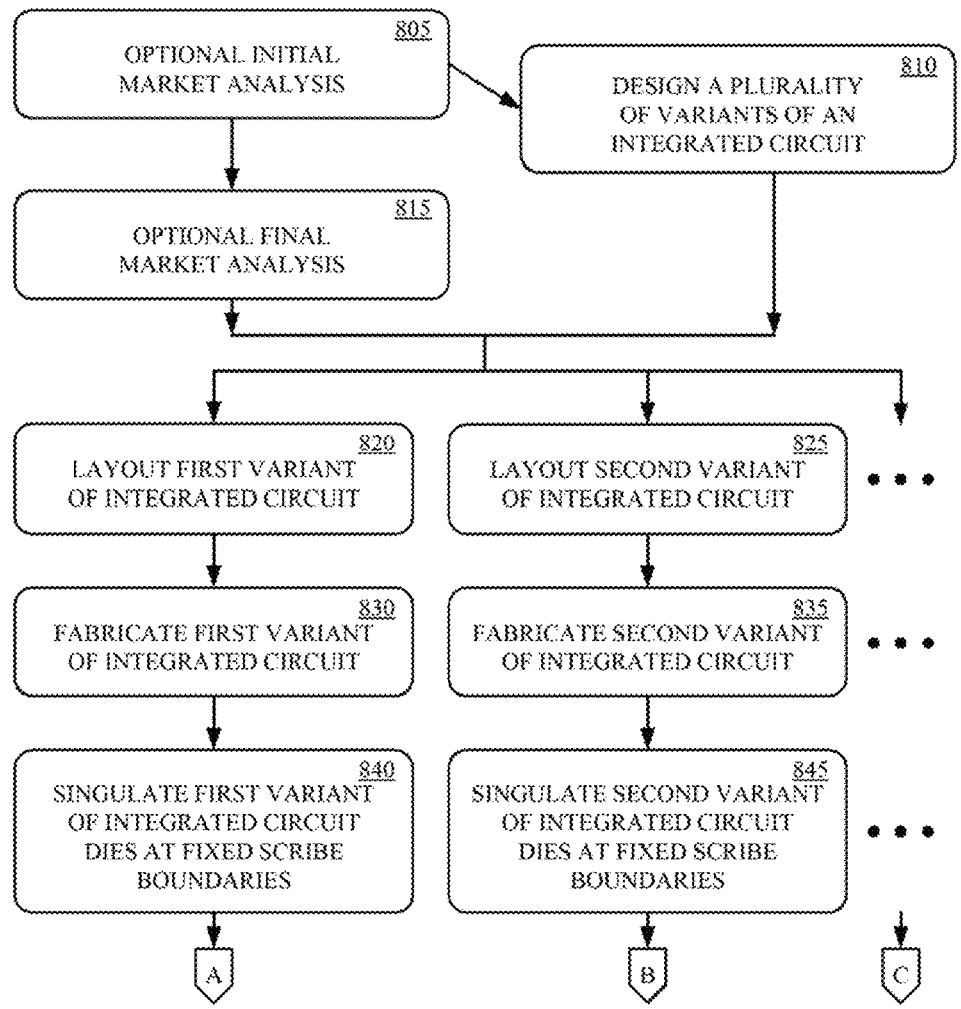
FIGS. 8A and 8B show a flow diagram of an exemplary product lifecycle of an integrated circuit according to a conventional art.
Figure 8B:
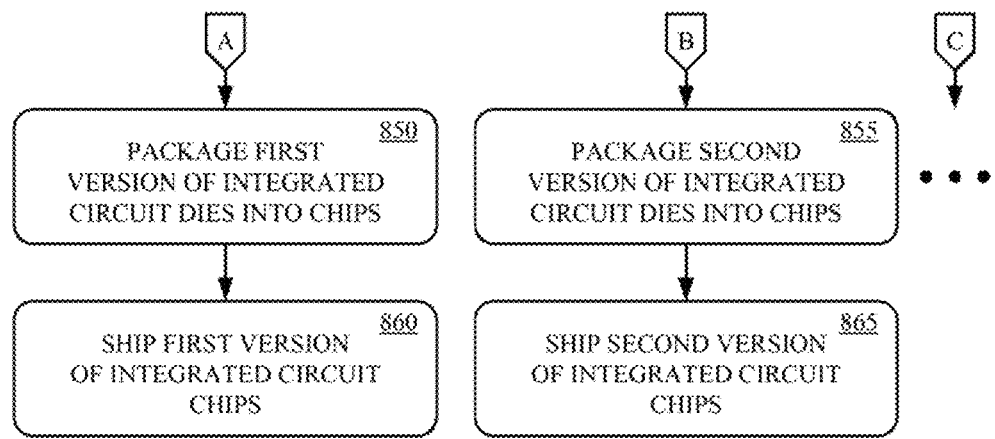

In contrast to embodiments of the present technology, an exemplary product lifecycle of an integrated circuit according to a conventional art is illustrated in FIGS. 8A and 8B. The product lifecycle according to the conventional art may begin with an optional initial market analysis prior to or during a design phase, at 805. The initial market analysis may identify product features, performance, costs and/or the like for the design of a product. The initial market analysis may also predict a demand for the product when it is expected to ship to customers. At 810, a plurality of variants of an integrated circuit may be designed. Each variant of the integrated circuit may be based upon a modular circuit architecture. At 815, additional market analysis may optionally be performed prior to or during a layout phase. The additional market analysis may be performed to improve the prediction of the demand for each of the plurality of variants in the product family when the product is expected to ship to customers.

At 820, 825, each of the plurality of variants of an integrated circuit are separately laid out. At 830, 835, each of the plurality of variants of the integrated circuit are separately fabricated on wafers according to the predicted demand and/or an expected yield. In the conventional art, each of the plurality of variants of the integrated circuit are separately fabricated from the start through fabrication of the metallization layers. The fabrication of multi-core graphics processors from the start through fabrication of the metallization layers may take approximately fourteen to twenty two weeks depending upon the design. The wafers for each of the plurality of variants of the integrated circuit are then separately singulated, at 840, 845. At 850, 855, the resulting die for each of the plurality of variants of the integrated circuit are then packaged in to corresponding chips. The plurality of integrated circuit chip variants may then be shipped to customers, at 860, 865. Accordingly, in the conventional art, fabrication is based upon a predicted demand and/or yield that is further back from the expected shipment date as compared to embodiments of the present technology. In an embodiment of the present technology, however, fabrication is based upon a predicted demand and/or yield that is made closer to the expected shipment date and therefore tends to be more accurate than as in the conventional art. Being able to adjust the fabrication mix of a plurality of integrated circuit variants up until the last one or more metallization layers that include interconnects and vias between particular groupings can reduce waste of integrated circuits and/or shortages of integrated circuits.

Embodiments of the present technology advantageously permit fungible wafer work-in-process. The techniques advantageously allow the final prediction of demand and/or estimated yield to be delayed weeks, months or more, which can provide a more accurate prediction of the demand and/or estimate of the yield. The work in progress may then be redirected to specific integrated circuit variants based upon the more accurate demand predictions and/or yield estimates.

The foregoing descriptions of specific embodiments of the present technology have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the present technology and its practical application, to thereby enable others skilled in the art to best utilize the present technology and various embodiments with various modifications as are suited to the particular use contemplated. It is intended that the scope of the invention be defined by the claims appended hereto and their equivalents.

What is claimed is:

1. A method comprising:
   predicting an initially demand for each of a plurality of selectable grouping of a modular circuit of an integrated circuit prior to fabricating the integrated circuit;
   designing the integrated circuit including the plurality of selectable groupings of a modular circuit based upon the predicted initial demand;
   laying out the designed integrated circuit including scribe boundaries between particular groupings of the modular circuit, and routing the interconnects and vias between modular circuits that cross the scribe boundaries between the particular groupings of the modular circuit in the last one or more metallization layers to be fabricated;
   fabricating the integrated circuit on one or more wafers accordingly to the layout up to but not including fabricating the interconnects and vias;
   predicting a revised demand for each of the plurality of selectable groupings of the modular circuit during fabrication of the integrated circuit up to but not including the interconnects and vias;
   selecting one or more of the plurality of groupings of the modular circuit based upon the predicted revised demand;
   fabricating a subset of the interconnects and vias of the integrated circuit according to the layout of the selected one or more groupings of the modular circuit; and
   singulating the wafer into a plurality of integrated circuit die according to the layout of the selected one or more groupings of the modular circuit.

2. The method according to claim 1, wherein the modular circuit comprises one or more processor cores and one or more associated peripheral circuits.

3. The method according to claim 1, wherein predicting the revised demand comprises a market analysis of each of the plurality of selectable groupings of the modular circuit.

4. The method according to claim 1, further comprising:
   estimating a yield for each of the plurality of selectable groupings of the modular circuit during fabrication of the integrated circuit up to but not including the interconnects and vias; and
   selecting the one or more of the plurality of groupings of the modular circuit further based upon the estimated yield.

5. The method according to claim 1, further comprising fabricating the integrated circuit on one or more wafers according to the layout and the predicted initial demand up to but not including the interconnects and vias.

6. The method according to claim 1, further comprising:
   analyzing a market to identify one or more attributes selected, from a group consisting of one or more product features, one or more performance metrics, one or more target costs, and the initial demand; and
   designing the integrated circuit including the plurality of selectable groupings of a modular circuit based on the market analysis.

7. The method according to claim 1, further comprising:
   analyzing a market to identify one or more attributes selected from a group consisting of one or more product features, one or more performance metrics, one or more target costs, and the initial demand; and laying out the integrated circuit based on the market analysis.

8. The method according to claim 1, wherein the integrated circuit includes a first set of modular circuits including a first processor core and a second set of modular circuits including a second processor core, wherein the first processor core and second processor core are different and the first and second modular circuits may be combined in selectable groupings.

* * * * *